United States Patent [19]

Capasso et al.

[11] Patent Number: 4,476,477
[45] Date of Patent: Oct. 9, 1984

[54] GRADED BANDGAP MULTILAYER AVALANCHE PHOTODETECTOR WITH ENERGY STEP BACKS

[75] Inventors: Federico Capasso, Westfield; Won-Tien Tsang, New Providence; Gareth F. Williams, Summit, all of N.J.

[73] Assignee: AT&T Bell Laboratories, Murray Hill, N.J.

[21] Appl. No.: 351,511

[22] Filed: Feb. 23, 1982

[51] Int. Cl.³ ............................................. H01L 37/14
[52] U.S. Cl. ...................................... 357/30; 357/13; 357/16; 357/61
[58] Field of Search ....................... 357/30, 16, 13, 61, 357/88, 30 A, 30 E

[56] References Cited

U.S. PATENT DOCUMENTS

| 4,203,124 | 5/1980 | Gordon et al. | 357/13 |
| 4,213,138 | 7/1980 | Campbell et al. | 357/30 |
| 4,231,049 | 10/1980 | Pearsall | 357/13 |
| 4,383,269 | 5/1983 | Capasso | 357/30 |
| 4,390,889 | 6/1983 | Capasso et al. | 357/30 |

FOREIGN PATENT DOCUMENTS 2084797  4/1982  United Kingdom ............. 357/30 A

OTHER PUBLICATIONS

R. J. McIntyre, "Multiplication Noise in Uniform Avalanche Diodes," *IEEE Transactions on Electron Devices*, vol. ED-13, No. 1, Jan. 1966, pp. 164–168.

R. Chin, et al., "Impact Ionisation in Multilayered Heterojunction Structures," *Electronics Letters*, vol. 16, No. 12, Jun. 5, 1980, pp. 467–469.

*Primary Examiner*—Martin H. Edlow
*Assistant Examiner*—William A. Mintel
*Attorney, Agent, or Firm*—Richard D. Laumann

[57] ABSTRACT

A multistage avalanche photodetector in which the ionization energy is provided by an energy band discontinuity is described. The photodetector provides low noise optical detection at low voltage.

18 Claims, 7 Drawing Figures

GRADED BANDGAP MULTILAYER AVALANCHE PHOTODETECTOR WITH ENERGY STEP BACKS

TECHNICAL FIELD

This invention relates generally to photodetectors and particularly to avalanche photodetectors.

BACKGROUND OF THE INVENTION

Photodetectors are devices that produce electrical signals in response to optical signals, and they are used in many aspects of modern technology. For example, photodetectors are used in optical astronomy, photovoltaic solar energy conversion devices, and as light detectors in optical communications systems.

A presently constructed and contemplated, optical communications systems will comprise a light source, and as a light emitting diode or a laser, and a photodetector which are optically coupled to each other through a glass transmission line that is commonly referred to as an optical fiber. Optical fibers presently used are silica based and have low losses in the region between 1.0 $\mu$m and 1.6 $\mu$m, and it is therefore believed that many of the future optical communications systems will operate within this region to take advantage of the low fiber losses in this region, although systems operating at both shorter and longer wavelengths will undoubtedly be constructed.

There are several types of photodetectors that can be used in optical communications systems. For example, photodiodes, phototransistors and avalanche photodiodes have been considered for use as photodetectors in such systems. Regardless of the particular type of photodetector selected, the photodetector must satisfy certain systems requirements such as adequate sensitivity at the wavelength or wavelengths of interest, adequate response time and as little noise as is possible.

Avalanche photodiodes are attractive candidates for use in optical communications systems because they typically have excellent response times and high gains. Their drawbacks generally include operation at relatively high voltages and an increased noise level which results from the avalanche multiplication process. It has long been realized, see, for example, R. J. McIntyre, *IEEE Transactions on Electron Devices*, ED-13, pp. 164–168, January, 1966, that low noise may be achieved at high gains by having a large ratio of the ionization coefficients ($\alpha,\beta$) for electrons and holes. The optical communications systems presently operating near 0.8 $\mu$m generally use photodetectors based on low noise silicon avalanche photodetectors which have a $\alpha/\beta$ ratio of approximately 50. Photodetectors for use between 1.0 $\mu$m and 1.6 $\mu$m will undoubtedly be based on Group III-V compound semiconductors and avalanche photodetectors using these compound semiconductors are under development. Unfortunately, the $\alpha/\beta$ ratio for most Group III-V compounds is approximately unity and the result is increased avalanche multiplication noise. Thus, devices having increased $\alpha/\beta$ ratios are of considerable practical importance.

Several avalanche photodetector structures have been proposed which enhance the $\alpha/\beta$ ratio. For example, a graded bandgap avalanche photodetector with $\alpha$ equal to approximately 5$\beta$ to 10$\beta$ has been fabricated by grading the avalanche region so that the probability of electron ionization is greatly increased while that for hole ionization is not. This photodetector was described at the Symposium on GaAs and Related Compounds held at Oyso, Japan in September 1981. A superlattice avalanche photodetector is proposed in *Electronics Letters*, 16, pp. 467–469, June 5, 1980. This article describes a device with an enhanced $\alpha/\beta$ ratio. The ratio may be as high as 20 and is obtained by band edge discontinuity assisted impact ionization using alternating wide and narrow gap layers. An enhanced ionization rate for electrons was obtained by having a discontinuity in the conduction band that is greater than the discontinuity in the valence band. Quantum wells were to be formed by narrow gap layers between wide gap layers. Increasing the number of quantum wells, at least up to 30 or 40 quantum wells, was expected to result in enhanced $\alpha/\beta$ ratios. A still larger number of quantum wells should produce essentially no increase in the ratio. However, the valence band discontinuity, at the trailing edge of the well, would be such that holes would inevitably ionize and therefore increase the noise in the avalanche process. Further, the conduction band discontinuity was necessarily small to avoid electron trapping in the quantum wells. This limits the achievable electron ionization enhancement and also requires the use of fields high enough to supply the remainder of the ionization energy. This also results in appreciable hole ionization.

SUMMARY OF THE INVENTION

We have found that a photodetector having a layer with a composition varying to produce an energy band step back that assists ionization of one type of carrier has desirable characteristics as an avalanche photodetector. The photodetector has one or more layers, varying in composition from a low bandgap material to a high bandgap material followed by an energy band step back to low bandgap material, intermediate a first layer having a first conductivity type and a second layer having a second conductivity type. The step back may be essentially abrupt, that is, within a small number of atomic layers, or more gradual. The energy step back assists the ionization of one type of carrier thereby increasing the ratio of ionization coefficients. The change in one band should be at least twice the change in the other band. In one preferred embodiment, the compositions are selected so that the energy band step back is approximately equal to or greater than the ionization energy in the low bandgap material following the high bandgap material. However, smaller step backs still result in an enhanced ionization ratio. In a further preferred embodiment, the photodetector has a plurality of layers, each layer varying in composition from a low bandgap material to a high bandgap material followed by an essentially abrupt step back to low bandgap material. The composition of these layers may vary linearly or in other manner such as stepwise. In another further preferred embodiment, the step back is primarily in the conduction band and therefore only electrons ionize in the ideal case. Devices of this invention are conveniently fabricated by molecular beam epitaxy techniques.

DETAILED DESCRIPTION

Figure 1:
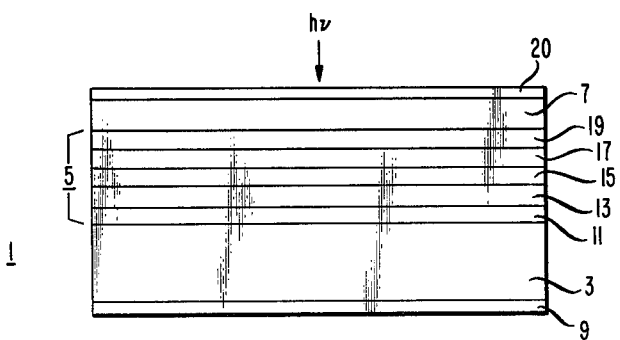
FIG. 1 is a sectional view of a device according to this invention.

An exemplary embodiment of a device according to this invention is schematically depicted in cross section in FIG. 1. For reasons of clarity, the elements of the device are not drawn to scale. After this exemplary embodiment has been described, several other embodiments and variations will be discussed and others will be apparent to those skilled in the art. The device, indicated generally as 1, comprises a layer 3 having a first conductivity type, compositionally varying graded bandgap layers indicated generally as 5, and layer 7 having a second conductivity type. Although only five graded bandgap layers, indicated as 11, 13, 15, 17 and 19 are shown, it should be understood that this number is for purposes of illustration only and a greater or lesser number may be used. Layer 3 may also be the substrate on which the graded bandgap layers are grown. Layer 20 forms an ohmic contact to layer 7 and contact 9 is made to layer 3. Light, indicated generally as $h\nu$, is incident on the photodetector as indicated by the arrow. The light, for maximum device efficiency, should be absorbed in a depleted narrow gap region at the beginning, i.e., the narrow bandgap region, of the first compositionally varying graded bandgap layer. It is generally desirable that the avalanche process be initiated by the carrier-type which has the larger ionization coefficient.

The thickness of the graded bandgap layers is generally not critical. However, the layers should not be so thick that they cannot be depleted when the device is biased. The maximum thickness thus depends, in a well-known manner, on the doping concentration and the number of layers. If the layers are too thin, then the required bias field may result in a significant amount of hole ionization. The bias field should be large enough to minimize trapping. Layer thicknesses will generally be within the range extending from approximately 50 Angstroms to approximately 10,000 Angstroms although greater thicknesses may be used if the doping concentration is low. The doping concentration should be low enough that the layers are depleted when the device is biased.

Figure 2:
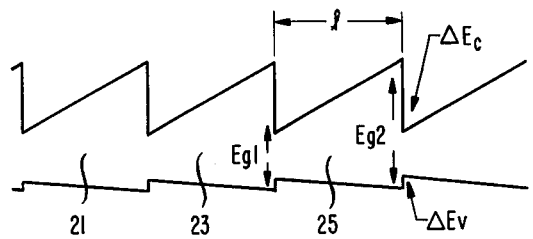
FIG. 2 is the energy band diagram of unbiased compositionally varying layers of a device of this invention.

The energy band diagram of the avalanche region 5 of a device according to this invention is shown in FIG. 2 for zero applied electric field. Three graded bandgap layers 21, 23 and 25 are depicted. In this embodiment, each layer has a thickness, l, and is linearly graded in composition from a low to a high bandgap material with an abrupt energy band step back to the low bandgap material. The thickness of each layer is l. As is shown on FIG. 2, the lowest bandgaps and the highest bandgaps are $E_{g1}$ and $E_{g2}$, respectively. The step backs or discontinuities in the conduction and valence bands are $\Delta E_c$ and $\Delta E_v$, respectively. The conduction band step back should be larger than and preferably at least approximately twice the valence band step back. The conduction band step back shown accounts for most of the bandgap difference as is typical of many Group III-V heterojunctions. In a preferred embodiment, the materials are selected so that the conduction band discontinuity, $\Delta E_c$, is approximately equal to or greater than the electron ionization energy in the low bandgap material which follows this step. A lesser discontinuity may be used but a higher applied voltage will be required as the electric field must supply the difference between the ionization energy and the step height. Similarly, the abrupt conduction band discontinuity may be replaced by a compositionally graded step back layer but a higher applied voltage will be required to replace the energy lost to optical phonon emission.

Figure 3:
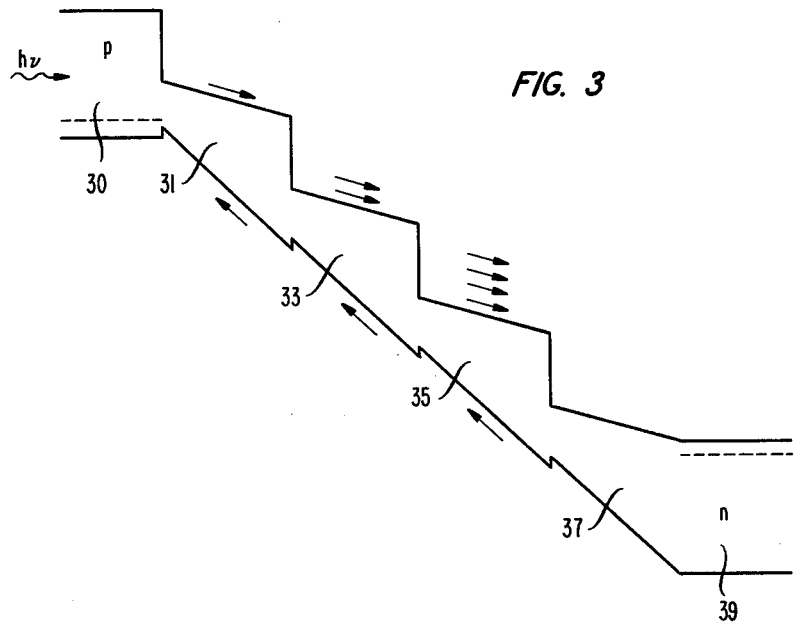
FIG. 3 is an energy band diagram of a biased device according to this invention.

The energy band structure for an avalanche photodetector using the multilayer avalanche region whose energy band diagram is represented in FIG. 2, is shown under bias in FIG. 3. The photodetector comprises n-type substrate 39, graded bandgap layers 31, 33, 35, and 37, and p-type layer 30. The first conductivity type is p-type and the second conductivity type is n-type. Substrate 39 corresponds to layer 3, and layer 30 corresponds to layer 7 for a front illuminated device according to FIG. 1. Although four layers are depicted, a greater or lesser number may be present. Layer 30 is desirably a wide bandgap material selected so that the incident light is not absorbed in this layer. Absorption within layer 30 is generally not desirable because the carriers then have to diffuse to the depletion region, i.e., the compositionally varying graded layers, resulting in a loss of device speed. The incident light is preferably absorbed within the first graded layer, i.e., layer 31.

The avalanche process will be briefly described for a preferred embodiment having an abrupt step back between the high and low bandgap materials. The light, indicated as $h\nu$, is absorbed in the depletion region next to the p-type contact, i.e., in layer 31, and a photoelectron is produced next to the contact. Due to the combined effects of the bias field $\epsilon$ and the grading field $\Delta E_c/l$, the photoelectron drifts toward the first conduction band step. The combined electric field is small enough so that the electron does not impact ionize before it reaches the conduction band step. After the step, the electron impact ionizes because the energy band discontinuity is comparable to or greater than the electron ionization energy and, if not, any deficiency is supplied by the applied electric field. This ionization process is repeated in each graded bandgap layer. After each step back, the electrons traverse a graded bandgap region in which they acquire the potential energy used for impact ionization in the low bandgap region following the next high bandgap-low bandgap step back or interface. Holes produced by photon absorption or impact ionization ideally do not acquire enough energy to ionize from either the electric field or the valence band discontinuities. The discontinuity in the valence band is of the wrong sign to assist hole ionization.

In the ideal case, the avalanche gain per layer is exactly two as each electron impact ionizes once after each conduction band step. Practically, the avalanche gain will be $2-\delta$ where $\delta$ is the fraction of electrons which do not impact ionize. The total gain of the photodetector is thus $M = (2-\delta)^N$ where N is the number of layers. Typically, most electrons will impact ionize if their energy is at least a tenth of an electron volt above the ionization energy. It is hypothesized that the high ionization probability results from the quadratic increase in the ionization cross section above the ionization energy due to the density of states. The competing loss mechanism is optical phonon emission and several phonons must be emitted to reduce the electron energy below the ionization energy.

For $\delta$ less than or equal to approximately 0.1, the excess noise factor is approximately $F=1+\delta(1-2^{-N})/2$ which for large N reduces to $F=1+\delta/2$. By way of contrast, for conventional avalanche multiplication, the smallest excess noise factor at large M is 2 even with no hole ionization. The excess noise for our preferred photodetector is less because the ionization process is less random than that in the conventional avalanche photodetector due to the fact that most of the electrons ionize at each step.

The advantages realizable in photodetectors of this invention may be better understood by considering the following example of a preferred embodiment. A five-stage detector having each layer graded from GaSb through lattice-matched AlGaAsSb to $AlAs_{0.08}Sb_{0.92}$ and approximately 3,000 Angstroms thick will have a value of M approximately equal to 32. If the bias field is $3 \times 10^4$ V/cm, the average hole ionization rate is small, even when the resonant hole ionization at the $Al_{0.065}Ga_{0.935}As_{0.005}Sb_{0.995}$ composition is considered. The effective electron field is reduced by the grading field to $10^4$ V/cm and the electron ionization rate in the graded section is negligible. The transport is preferably at the saturation velocity and the average electron is several tenths of an eV. Therefore, the majority of the electrons will ionize at the conduction band step despite the 0.08 eV deficit when the total operating voltage is approximately 5 volts.

The low operating voltage of this preferred embodiment of this detector is easily understood when it is considered that the ionization energy is delivered abruptly to the electrons by the conduction band steps rather than gradually via the applied electric field as is done in a conventional avalanche photodetector. Consequently, the competing energy losses by phonon emission are much smaller and most of the applied voltage is used to create electron-hole pairs. The low voltage operation also minimizes the device leakage current. It should be noted that if the electron drift field is reduced, fewer electrons will have the energy required for ionization and the gain may be varied from approximately 32 down to approximately unity. The resulting voltage variable gain may be useful for wide dynamic range receivers. This might be useful in variable length systems such as loop feeders.

The valance band steps will not assist hole ionization and as a result, any hole ionization is due to the applied electric field $\epsilon$ only. For electron transport across the graded region, the bias field $\epsilon$ must cancel the $\Delta E_c/l$ conduction band electric field and provide a small extra component to assure drift rather than diffusion transport. The device is then designed so that the hole ionization rate at this field is small. The maximum multiplication is determined by the number of such layers, which is limited by the depletion width at the lowest achievable intrinsic region doping.

Many materials may be selected in fabricating the device and the particular material selected will depend upon the wavelength of interest. For example, Group III–V or Group II–VI compound semiconductors may be used. For the wavelength region currently of greatest interest, that is between 1.0 $\mu$m and 1.6 $\mu$m, materials systems of greatest interest appear to be Group III–V compound semiconductor systems such as AlGaAsSb/GaSb grown on GaSb substrates, InGaAlAs/InGaAs grown on InP substrates, and InGaAsSb/GaSb grown on GaSb substrates. Group II–VI systems, such as $Hg_{1-x}Cd_xTe$ grown on any lattice-matched substrate, may also be used. For the first materials system, which has already been discussed, the minimum electron ionization energy is 0.80 eV (GaSb) and the maximum bandgap difference is 0.85 eV, of which approximately 85% appears in the conduction band thus giving a conduction band step of approximately 0.72 eV. The 0.08 eV deficit is easily furnished by the electron drift field.

The second materials system mentioned presently appears less promising because the ionization threshold may be as high as approximately 1 eV due to the band nonparabolicity while the conduction band step back is only approximately 0.6 eV. Experimentally, it has been found that the ionization energy appears clearly greater than that of GaSb and the ionization rates are approximately an order of magnitude smaller although phonon scattering is much greater in GaSb because the satellite valley is only approximately 0.08 eV above the band edge. InGaAsP/InP grown on InP substrates presently appears to be a less desirable system because it is believed that both the conduction band and valence band steps are large.

The devices of this invention are conveniently grown by molecular beam epitaxy. For the $Al_xGa_{1-x}As_ySb_{1-y}$/GaSb lattice-matched system, the lowest bandgap material (GaSb) has a bandgap of 0.73 eV and the highest bandgap material ($AlAs_{0.08}Sb_{0.92}$) has a bandgap of 1.58 eV. The grading between these compositions must be on the Y=0.08x lattice-matched line. Molecular beam epitaxy is a desirable technique for several reasons. First, the vapor pressures of all four constituents depend linearly on the effusion cell temperature over several decades of pressure. Second, the sticking coefficients of Al, Ga and Sb are essentially unity at growth temperatures within the typical range of 500 to 650 degrees C. while that of $As_4$ is much less. Thus, the desired solid compositions may be grown by controlling only the three partial pressures of Al, Ga and Sb while maintaining an arsenic overpressure. The partial pressures are conveniently varied by varying the oven temperatures. The oven temperatures may be varied continuously leading to continuous compositional changes in steps which lead to compositional steps. Other methods, such as chemical vapor deposition (CVD) and vapor phase epitaxy, etc., may also be used. CVD may result in less sharp steps which may reduce hole trapping. The structure may be any of the conventional configurations, e.g., planar or mesa.

Figure 4:
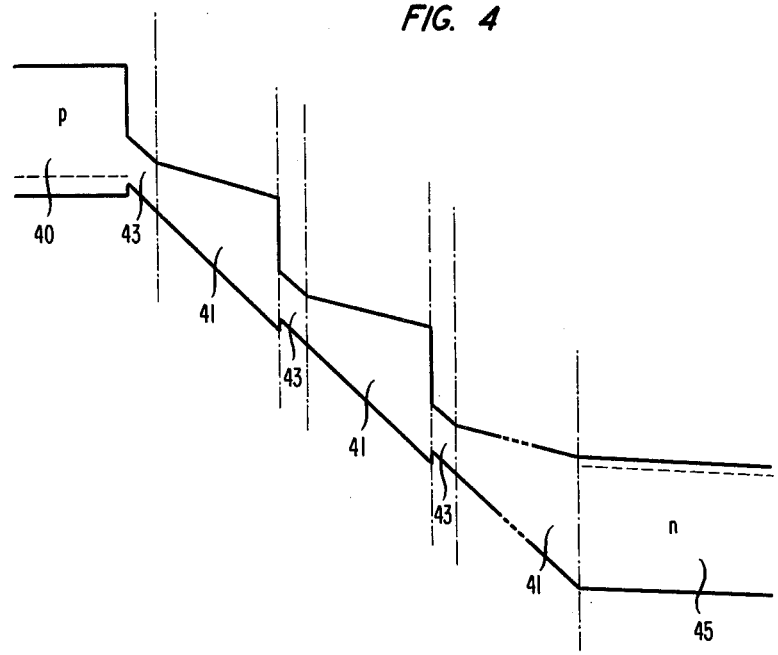
FIG. 4 is the energy band diagram of yet another device according to this invention.

The embodiment specifically described above has a linear compositional grading from a low bandgap composition to a high bandgap composition in each stage. However, embodiments using other compositional gradings may be desirable and are contemplated. Several such gradings will be briefly described. In FIG. 4, the energy band diagram of yet another embodiment is depicted. The compositionally varying layers are indicated as 41 and the p-type and n-type layers are indicated as 40 and 45, respectively. In this embodiment, each compositionally varying layer has an ungraded or slowly graded narrow gap region, indicated as 43, provided after each bandgap step back to increase the fraction of electrons that cause ionization. A typical length for the ungraded or slowly graded regions 43 would be several ionization lengths. The ionization probability at the steps may also be increased by adding an ungraded or slowly graded wide gap region just before each step as depicted in the energy band diagram shown in FIG. 5. In this embodiment, the primary compositionally varying graded regions are indicated as 51 and the ungraded or slowly graded wide gap regions thereof are indicated as 53. The p-type and n-type layers are indicated as 50 and 55, respectively. In region 53, the electrons see the full applied field, as the opposing quasielectric field due to the compositional grading is absent. This increases the average electron energy above the band edge and increases the ionization probability after the step. Additionally, for long wavelength detectors, a narrow gap absorption region can be added to the beginning of the first layer with the resulting structure of the first layer being similar to the layer structure shown in FIG. 4.

The electric field in the depletion region may be controlled by adding appropriate dopants. For example, a p-type dopant upon depletion leaves a negatively charged core while an n-type dopant leaves a positively charged core. These charges can then be used to tailor the spatial dependence of the depletion region field. This may be useful, for example, when it is desired to have a high field at the step back to increase electron ionization or to reduce hole trapping, as by increasing tunneling through the valence barrier at the step back. The high field at the step back for the devices of FIGS. 3-7 may be created by doping the wide gap region with a p-type dopant before each step back and the narrow gap region with an n-type dopant after each step back. The resulting fully depleted p-n junction at the step back adds to the externally applied field. The high field region should be short enough to avoid band-to-band tunneling. This doping technique may also be used to reduce the electric field in a narrow gap absorption region at the beginning of the avalanche region or a narrow gap region after each step back. The doping must be low enough so that the avalanche region can be fully depleted. Other applications will be readily thought of by those skilled in the art.

The detectors of the preferred embodiments described above are ideal cases as: (1) the conduction band discontinuity is greater than or approximately equal to the ionization energy, (2) there is an abrupt high-to-low gap material grading at the steps, and (3) there is continuous compositional grading between the steps. In some embodiments, these conditions may be desirably modified. For example, the discontinuity in the conduction band energy may be less than the ionization energy with the remaining energy required for ionization being supplied by the electric field. However, as this electric field also acts on the holes, the hole ionization coefficient is no longer negligible and the result will be increased device noise. However, the effective electron ionization potential is reduced and the $\alpha/\beta$ ratio will be enhanced over that of the conventional avalanche photodetector.

Step backs smaller than the ionization energy will typically result in a lesser probability of ionization and for a given multiplication, more layers will be required. The structure of FIG. 5 may be of particular interest in this case.

Furthermore, an abrupt high-to-low gap material discontinuity is not required in our devices as a more gradual transition can also produce ionization, i.e., the step back may be gradual rather than abrupt. In these devices, the ionization is due to the quasielectric field resulting from the compositional grading of the step back plus the applied electric field. With a gradual rather than an abrupt step back bandgap transition, the electrons may lose energy to optical phonons before achieving the ionization energy. This effect is avoided with the abrupt discontinuity. Thus, the applied electric field must be increased to compensate and results in operating voltages higher than those for the devices discussed with respect to FIGS. 1-5. At the higher electric fields, hole ionization is more important and the devices will be noisier. However, this device may be preferred for growth techniques where the fabrication of an abrupt interface is difficult. Further, any hole trapping is reduced by the gradual step back grading.

Figure 6:
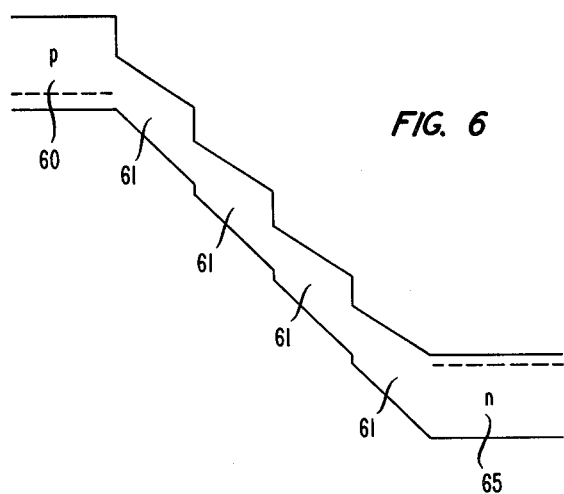
FIG. 6 is the energy band diagram of another device according to this invention.

Another possible energy band diagram is shown in FIG. 6. The p-type and n-type layers are 60 and 65, respectively, and the compositionally varying layers are indicated as 61. In this embodiment, the steps in the valence bands are such that hole trapping is not possible. If present knowledge is accurate, this embodiment may be fabricated with the InGaAsSb/GaSb system.

Figure 7:
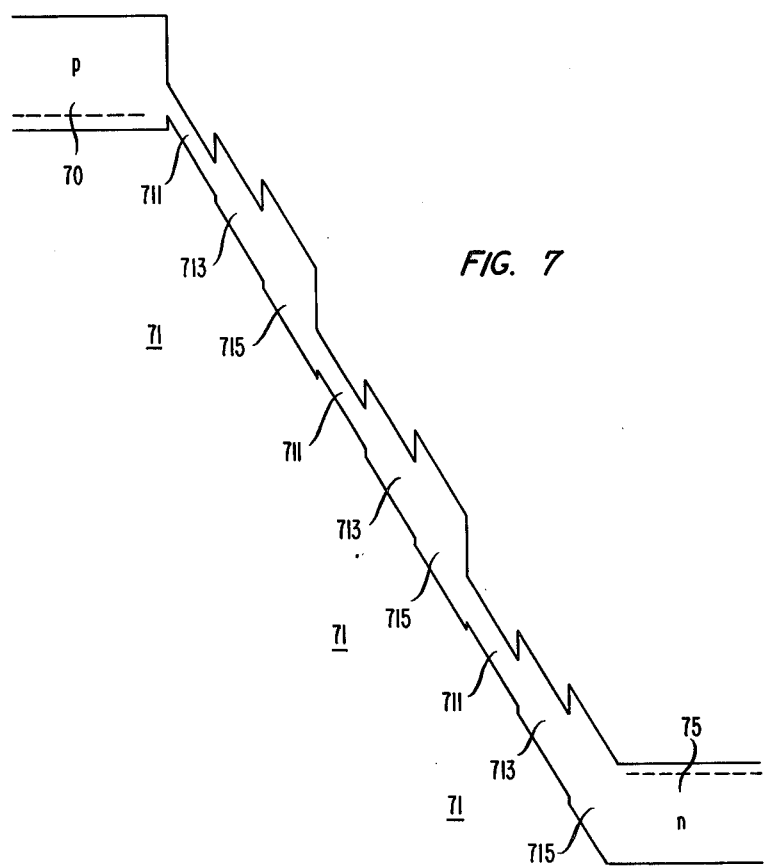
FIG. 7 is the energy band diagram of another device according to this invention.

Yet another embodiment results from allowing a stepwise rather than a continuous compositional grading. Such an embodiment is depicted in FIG. 7. The p-type and n-type layers are 70 and 75, respectively, and each layer 71 further comprises sub-layers 711, 713, and 715. The principle of operation is similar to that of a continuously graded detector except that the electric field must be sufficiently large to avoid trapping of electrons in the conduction band steps between sub-layers. The greater the number of steps, which should number at least three, the smaller the field required. A lesser number of steps is undesirable as it may result in substantial electron trapping or discontinuity-assisted hole ionization. Also, the step back, in addition to being abrupt, may alternatively be gradual or may comprise discrete steps. This embodiment may be of special interest when the growth of a continuously graded layer is more difficult than the growth of sub-layers of different compositions.

Additionally, the embodiments discussed above enhance the electron ionization while preventing or reducing hole ionization. This is accomplished by the large discontinuities in the conduction band. Alternatively, if the major discontinuity is in the valence band rather than in the conduction band, hole ionization is increased while that of the electrons is prevented. For such embodiments, the discontinuity in the valence band should preferably be at least twice the discontinuity in the conduction band. Further, the wide gap portion of each layer will be nearest the p-type side and the narrow gap of each layer will be nearest the n-type layer. Light will desirably be absorbed at the n-type side of the device. The grading of the compositionally varying layers will be from the narrow gap to the wider gap followed by a step back. Any further modifications of embodiments of electron ionization devices needed to construct hole ionization devices will be apparent to those skilled in the art.

Figure 5:
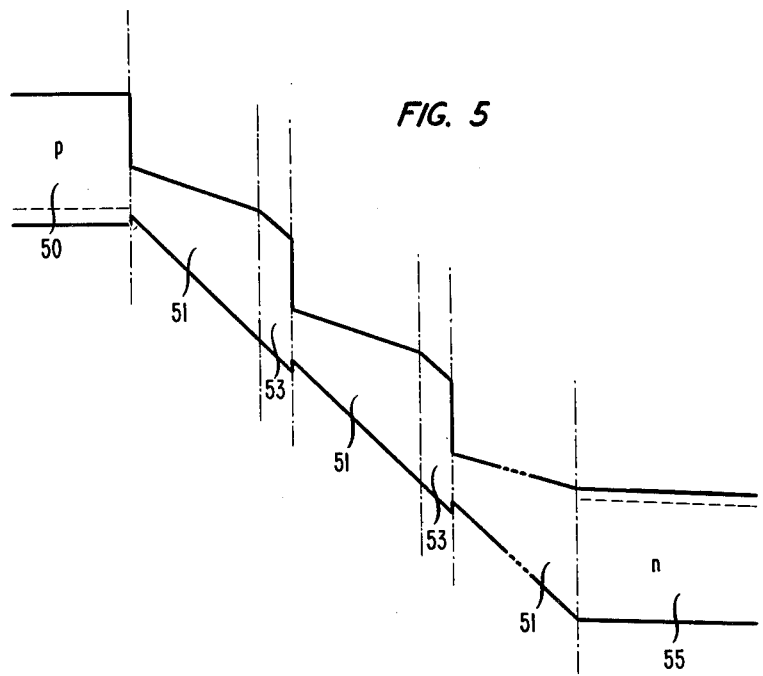
FIG. 5 is the energy band diagram of still another device according to this invention.

Further, various of the compositional variations described may be combined in single devices. That is, for example, the first compositionally varying layer may have a linear compositional variation and an abrupt step back and the second compositionally varying layer may have a discrete compositional variation and a gradual step back, etc. In devices with continuous compositional variations, the variation may be linear, parabolic, etc. Additionally, a layer may have an ungraded or slowly graded narrow gap region as shown in FIG. 4 and an ungraded or slowly graded wide gap region as shown in FIG. 5. Additionally, depletion region doping, for example, to increase the field at the step back, may be combined with any of the embodiments as may a low gap optical absorption region at the beginning of the first layer. Additionally, combinations of these graded layers with ungraded regions may also be used.

Still other embodiments will be readily thought of by those skilled in the art.

We claim:

1. An avalanche photodetector comprising a first layer having a first conductivity type, a second layer having a second conductivity type, and disposed intermediate said first layer and said second layer at least one compositionally varying layer having a composition varying from a low bandgap composition to a high bandgap composition, said compositionally varying layer having an energy band step back after said high bandgap that assists ionization of one type of carrier.

2. A photodetector as recited in claim 1 in which said at least one compositionally varying layer is essentially continuously graded.

3. A photodetector as recited in claim 2 in which said at least one compositionally varying layer has an essentially linear compositional variation.

4. A photodetector as recited in claim 1 in which said at least one compositionally varying layer has at least three sub-layers.

5. A photodetector as recited in claim 1, 2, 3, or 4 in which said energy band step back is approximately equal to or greater than said one type of carrier ionization energy in the low gap material after said step back.

6. A photodetector as recited in claim 5 in which said energy band step back is primarily in the conduction band.

7. A photodetector as recited in claim 1, 2, 3, or 4 in which said step back is essentially abrupt.

8. A photodetector as recited in claim 7 in which said compositionally graded layer further comprises a slowly graded narrow gap region adjacent said energy band step back whereby the number of carriers that cause ionization increases.

9. A photodetector as recited in claim 7 in which said compositionally graded layer further comprises a slowly graded wide gap region adjacent said energy band step back whereby the average carrier energy above the band edge is increased.

10. A photodetector as recited in claim 1, 2, 3, or 4 in which said step back is graded.

11. A photodetector as recited in claim 10 in which said compositionally graded layer further comprises a slowly graded narrow gap region adjacent said energy band step back whereby the number of carriers that cause ionization increases.

12. A photodetector as recited in claim 10 in which said compositionally graded layer further comprises a slowly graded wide gap region adjacent said energy band step back whereby the average carrier energy above the band edge is increased.

13. A photodetector as recited in claim 1, 2, 3, or 4 in which said layers comprise at least one member selected from the group consisting of $Al_xGa_{1-x}As_ySb_{1-y}/GaSb$, $In_xGa_{1-x}Al_yAs_{1-y}/InGaAs$, $In_xGa_{1-x}As_{1-y}Sb_y/GaSb$ and $Hg_{1-x}Cd_xTe$.

14. A photodetector as recited in claim 1, 2, 3, or 4 further comprising a p-type dopant in said high bandgap composition.

15. A photodetector as recited in claim 1, 2, 3, or 4 further comprising a n-type dopant in said low bandgap composition.

16. A photodetector as recited in claim 1, 2, 3, or 4 further comprising a p-type dopant in said low bandgap composition.

17. A photodetector as recited in claim 1, 2, 3, or 4 further comprising a n-type dopant in said high bandgap composition.

18. A photodetector as recited in claim 5 in which said energy band step back is primarily in the valence band.

* * * * *